US009590173B2

(12) United States Patent
Iwayama

(10) Patent No.: US 9,590,173 B2
(45) Date of Patent: Mar. 7, 2017

(54) MAGNETIC MEMORY AND METHOD FOR MANUFACTURING THE SAME

(71) Applicant: Masayoshi Iwayama, Seoul (KR)

(72) Inventor: Masayoshi Iwayama, Seoul (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 62 days.

(21) Appl. No.: 14/645,226

(22) Filed: Mar. 11, 2015

(65) Prior Publication Data

US 2016/0072051 A1 Mar. 10, 2016

Related U.S. Application Data

(60) Provisional application No. 62/047,580, filed on Sep. 8, 2014.

(51) Int. Cl.
| | |
|---|---|
| *H01L 21/00* | (2006.01) |
| *H01L 29/82* | (2006.01) |
| *H01L 43/10* | (2006.01) |
| *H01L 43/08* | (2006.01) |
| *H01L 43/12* | (2006.01) |
| *H01L 27/22* | (2006.01) |

(52) U.S. Cl.
CPC ............ *H01L 43/10* (2013.01); *H01L 27/228* (2013.01); *H01L 43/08* (2013.01); *H01L 43/12* (2013.01)

(58) Field of Classification Search
CPC .............................. H01L 43/10; H01L 27/228
USPC ...................... 257/421; 438/59, 61
See application file for complete search history.

(56) References Cited

U.S. PATENT DOCUMENTS

| | | | | |
|---|---|---|---|---|
| 8,922,018 | B2 * | 12/2014 | Ishizaki | H01L 27/2481 257/751 |
| 9,230,642 | B2 | 1/2016 | Ryoo et al. | |
| 9,306,152 | B2 * | 4/2016 | Iwayama | H01L 43/08 257/421 |
| 9,373,783 | B1 | 6/2016 | Debrosse et al. | |
| 2007/0054450 | A1 | 3/2007 | Hong et al. | |
| 2008/0135958 | A1 | 6/2008 | Kajiyama et al. | |
| 2011/0117677 | A1 | 5/2011 | Yuan et al. | |
| 2011/0175181 | A1 | 7/2011 | Kang et al. | |
| 2014/0070162 | A1 | 3/2014 | Iwayama | |
| 2016/0027843 | A1 * | 1/2016 | Kumura | H01L 27/228 257/295 |

FOREIGN PATENT DOCUMENTS

JP 2012174709 A 9/2012

OTHER PUBLICATIONS

U.S. Appl. No. 14/629,023; First Named Inventor: Yoshinori Kumura; Title: "Semiconductor Memory Device and Manufacturing Method Thereof"; filed Feb. 23, 2015.

* cited by examiner

*Primary Examiner* — Calvin Lee
(74) *Attorney, Agent, or Firm* — Holtz, Holtz & Volek PC

(57) ABSTRACT

According to one embodiment, a magnetic memory is disclosed. The magnetic memory includes a substrate and an underlying layer provided on the substrate. The underlying layer includes a first underlying layer and a second underlying layer surrounding the first underlying layer. The first and second underlying layers contain a metal of a same type. The first underlying layer includes a lower part which is greater than the upper part in width. The magnetic memory further includes a magnetoresistive element provided on the underlying layer.

20 Claims, 11 Drawing Sheets

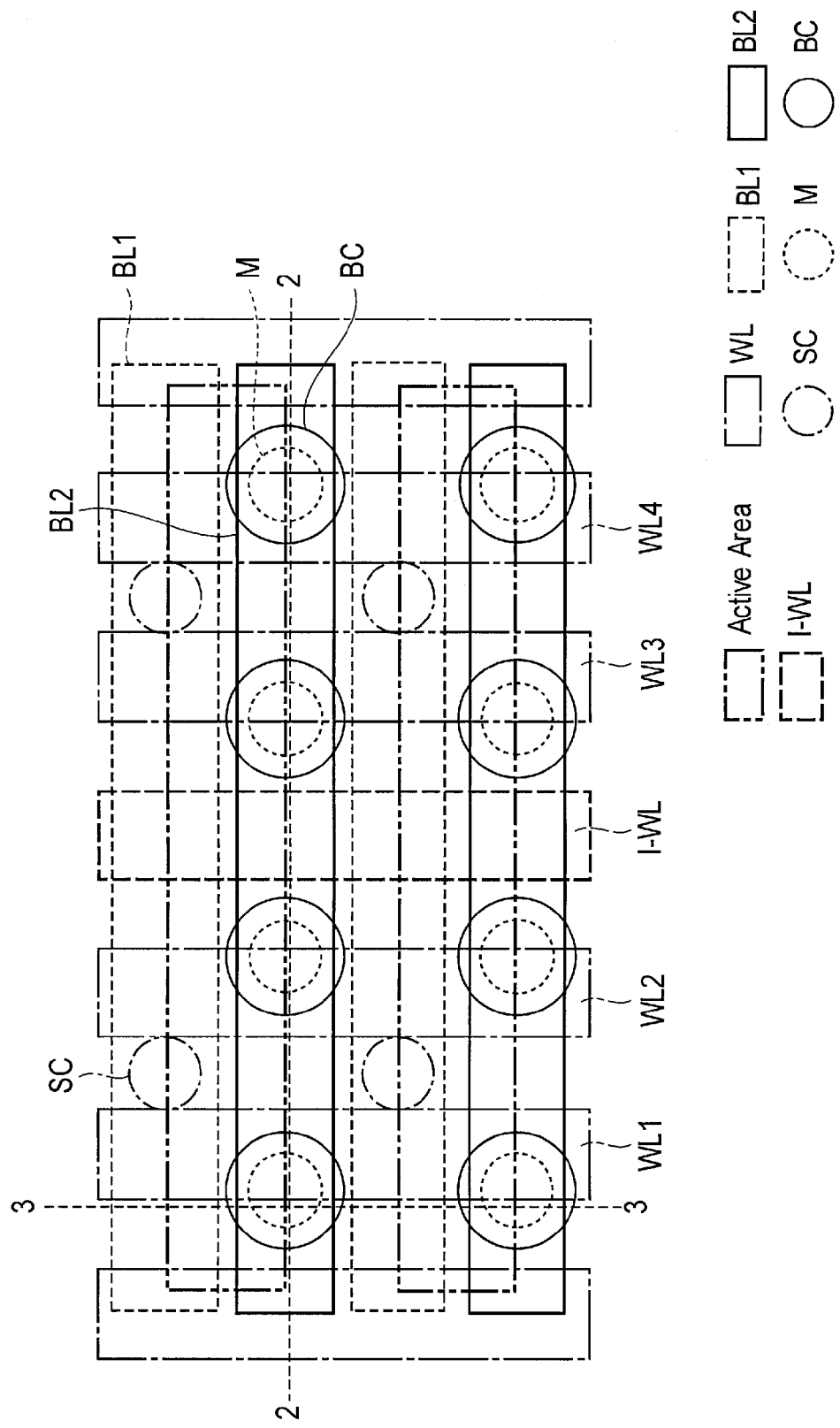
F I G. 1

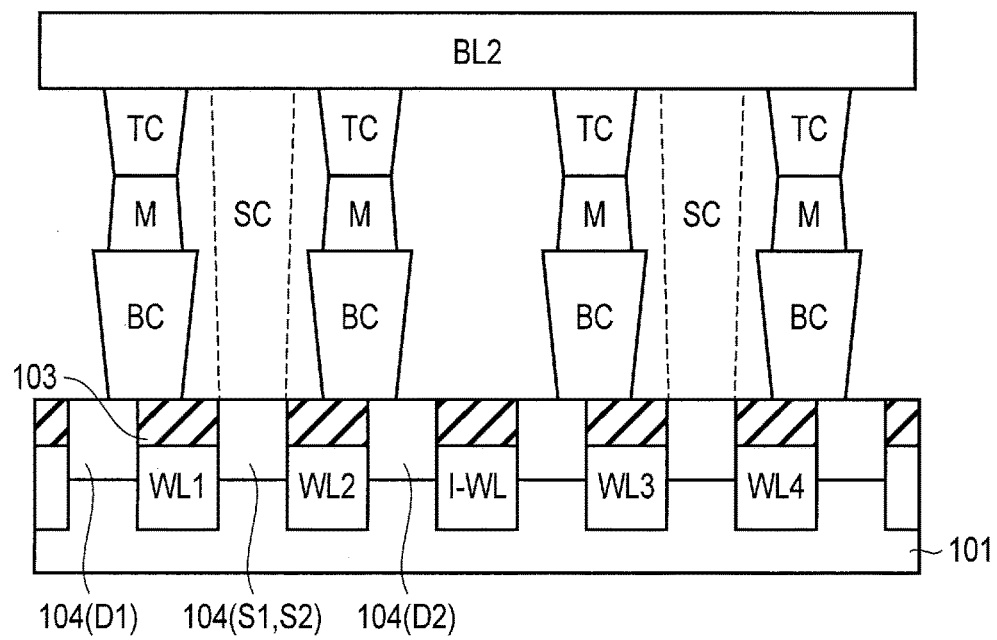
F I G. 2
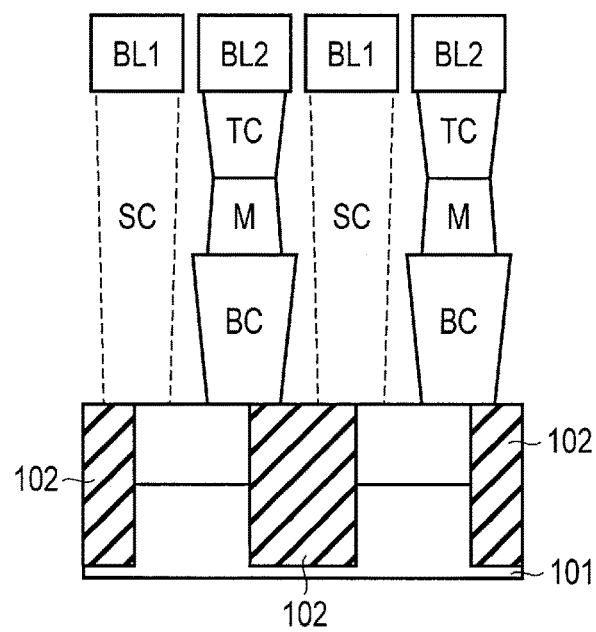
F I G. 3

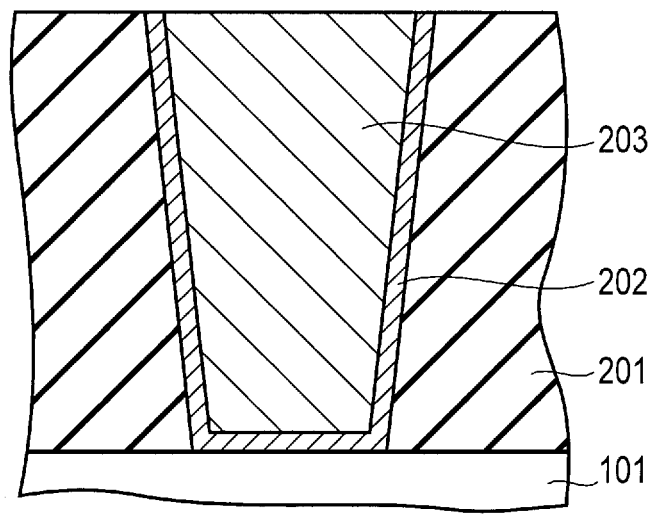
F I G. 4
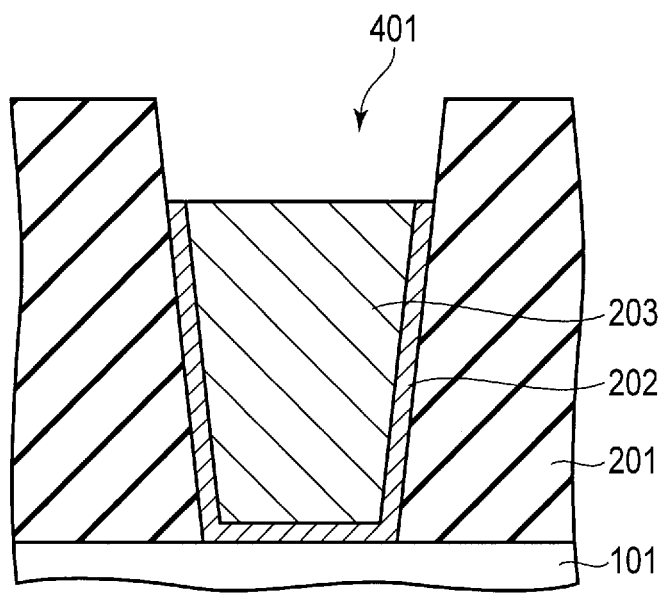
F I G. 5

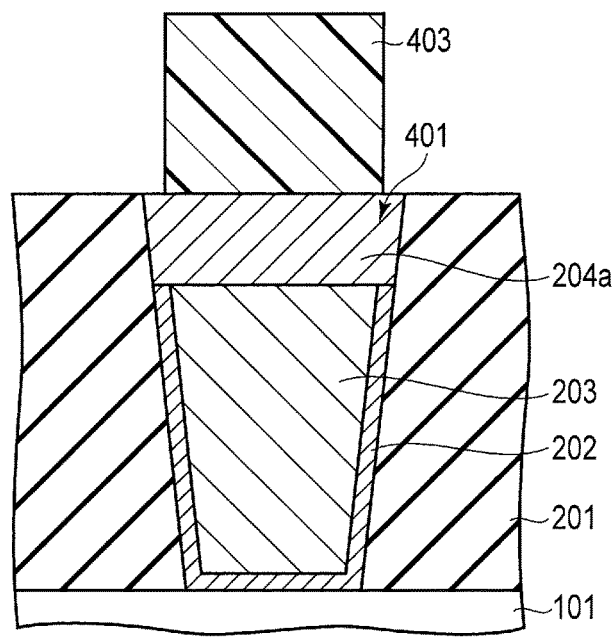
F I G. 8
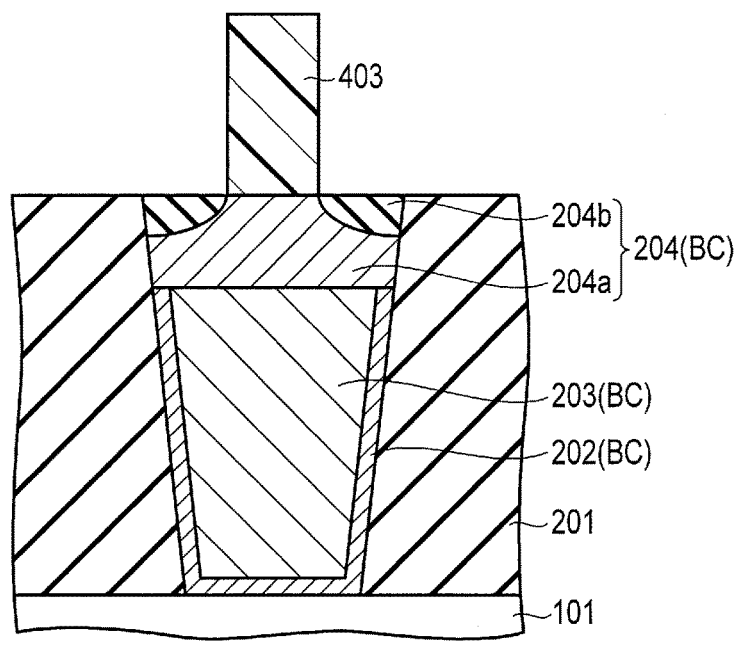
F I G. 9

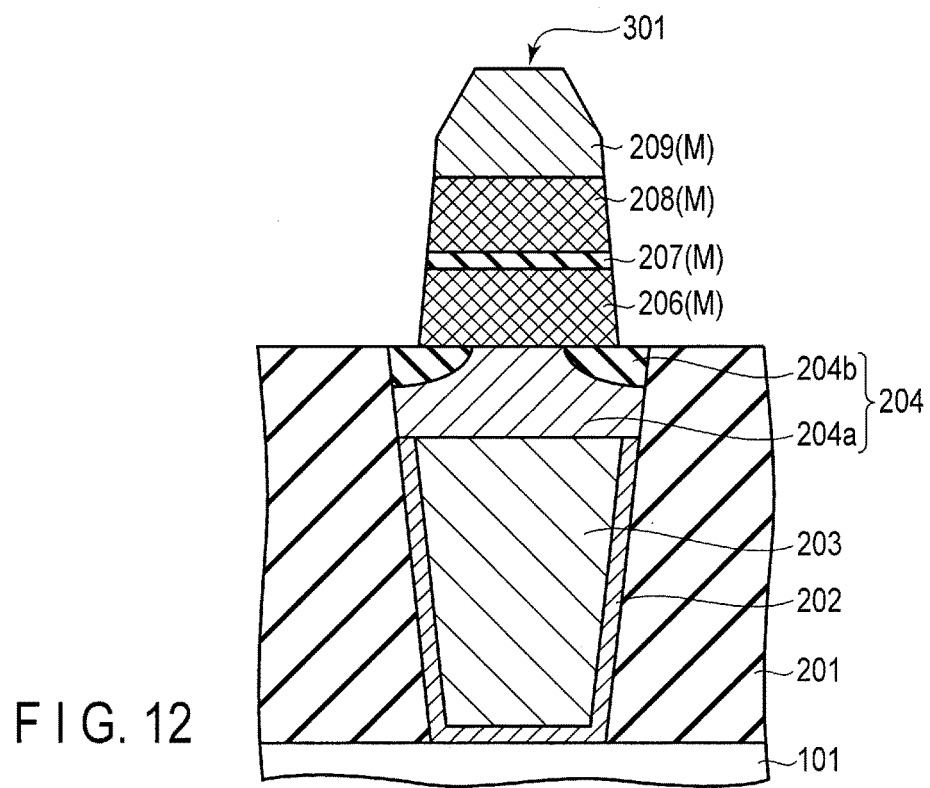
F I G. 12
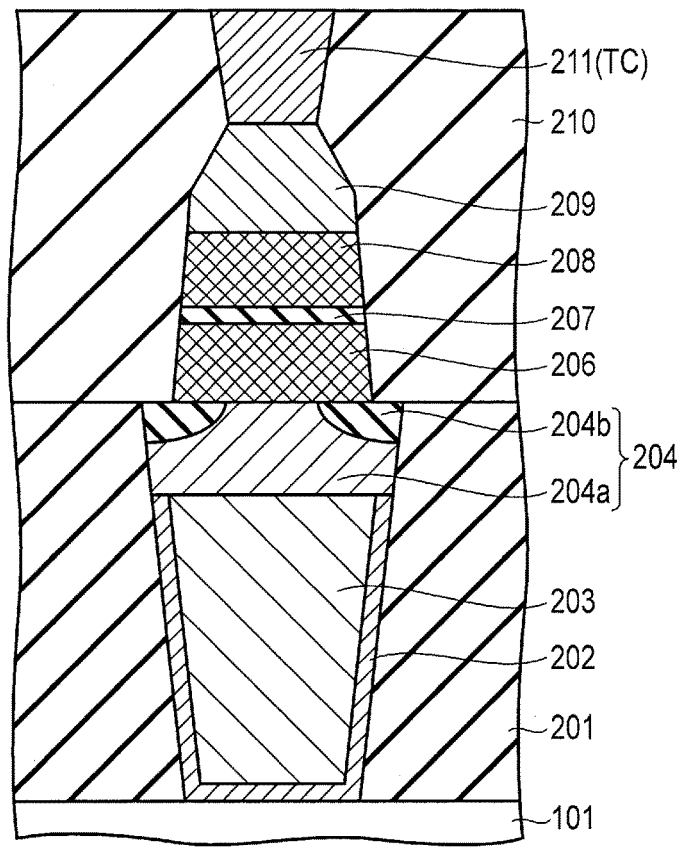
F I G. 13

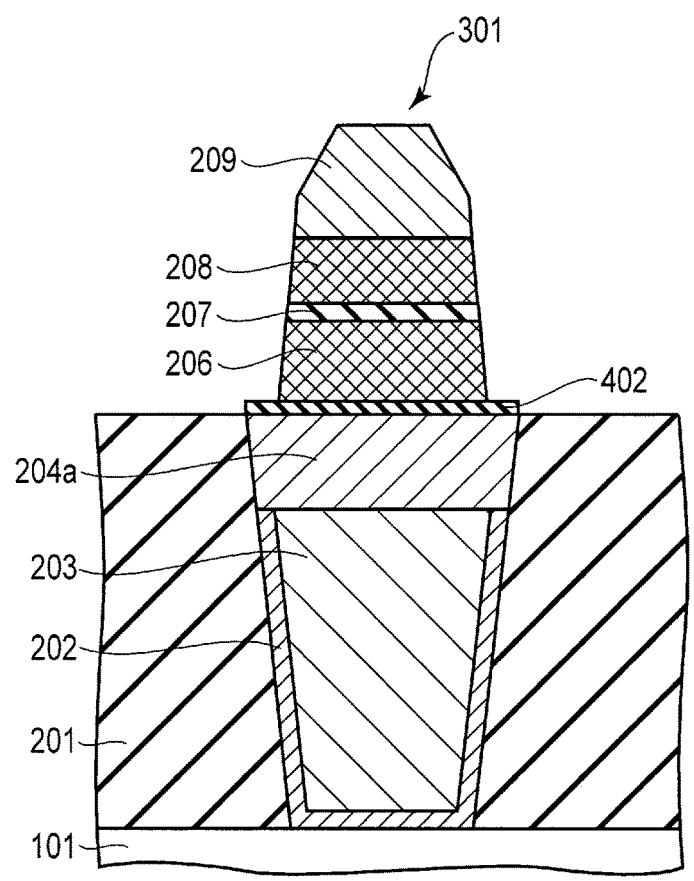
F I G. 15
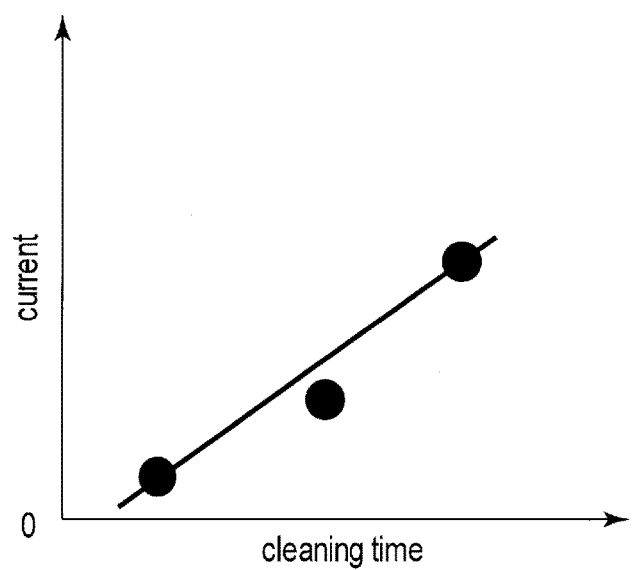
F I G. 16

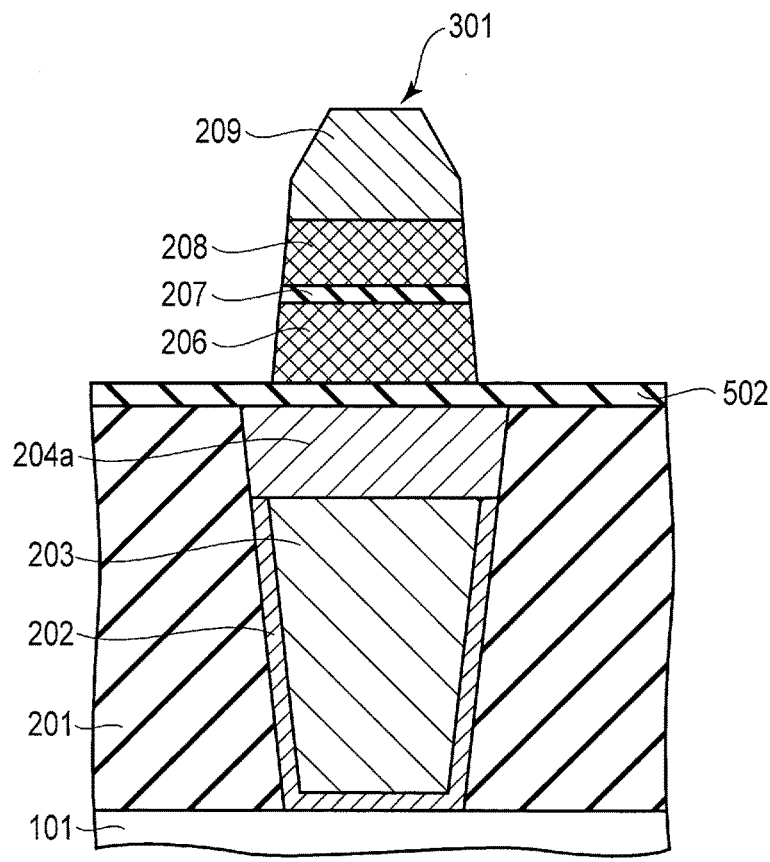
F I G. 17
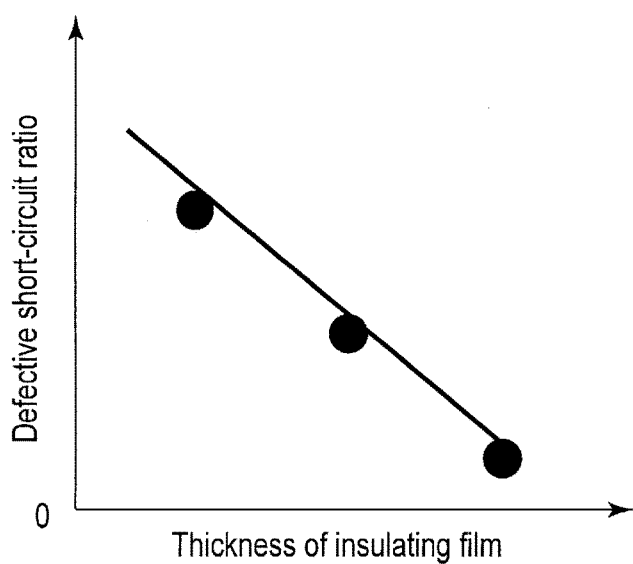
F I G. 18

MAGNETIC MEMORY AND METHOD FOR MANUFACTURING THE SAME

CROSS-REFERENCE TO RELATED APPLICATIONS

This application claims the benefit of U.S. Provisional Application No. 62/047,580, filed Sep. 8, 2014, the entire contents of which are incorporated herein by reference.

FIELD

Embodiments described herein relate generally to a magnetic memory and a method for manufacturing the same.

BACKGROUND

In recent years, a semiconductor memory using a resistance change element as a storage element, such as a PRAM (phase-change random access memory) or an MRAM (magnetoresistive random access memory) has been attracting attention and been developed. The MRAM is a device which performs a memory operation by storing binary 1 or 0 in a memory cell by using magnetoresistance, and features non-volatility, high-speed operation, high integration, and high reliability.

One of the magnetoresistive elements is a magnetic tunnel junction (MTJ) element including a laminated structure of three layers, namely, a storage layer having a variable magnetization direction, an insulating film as a tunnel barrier, and a reference layer maintaining a predetermined magnetization direction.

The resistance of the MTJ element varies with the magnetization directions of the storage layer and the reference layer, has a minimum value when the magnetization directions are parallel and has a maximum value when the magnetization directions are antiparallel, and stores information by associating the parallel state and the antiparallel state with binary 0 and 1.

There are schemes for writing information on the MTJ element: one is a magnetic field writing scheme in which only the magnetization direction of the storage layer is reversed by a current magnetic field generated when a current flows through a write line, and another is a writing scheme (of spin-injection) using spin angular momentum transfer in which the magnetization direction of the storage layer is reversed by passing a spin-polarized current through the MTJ element itself.

In the former scheme, when the element size is reduced, the coercivity of the magnetic body constituting the storage layer increases, and thus the write current tends to increase. Consequently, it is difficult to achieve both miniaturization and low current.

On the other hand, in the latter scheme (spin-injection writing scheme), the smaller the volume of the magnetic layer constituting the storage layer, fewer spin-polarized electrons will need to be injected. Therefore, it is expected that miniaturization and low current can both be easily achieved.

BRIEF DESCRIPTION OF THE DRAWINGS

FIG. 1 is a plan view schematically showing a magnetic memory according to an embodiment;

FIG. 2 is a cross-sectional view taken along line 2-2 of FIG. 1;

FIG. 3 is a cross-sectional view taken along broken line 3-3 of FIG. 1;

FIG. 4 is a cross-sectional view for explaining a method for manufacturing a magnetic memory according to an embodiment;

FIG. 5 is a cross-sectional view for explaining the method for manufacturing the magnetic memory following FIG. 4;

FIG. 8 is a cross-sectional view for explaining the method for manufacturing the magnetic memory following FIG. 7;

FIG. 9 is a cross-sectional view for explaining the method for manufacturing the magnetic memory following FIG. 8;

FIG. 12 is a cross-sectional view for explaining the method for manufacturing the magnetic memory following FIG. 11;

FIG. 13 is a cross-sectional view for explaining the method for manufacturing the magnetic memory following FIG. 12;

FIG. 15 shows a cross-sectional surface showing a structure of an MTJ element according to a comparative example;

FIG. 16 shows a relationship between a dry-cleaning time of the MTJ element and a current flowing between the MTJ element and a lower electrode according to the comparative example;

FIG. 17 shows a cross-sectional surface showing the structure of the MTJ element according to another comparative example;

FIG. 18 shows a relationship between a thickness of an insulating film on an underlying layer of the magnetic memory and a defective short-circuit ratio of the MTJ element according to the comparative example;

DETAILED DESCRIPTION

Figure 6:
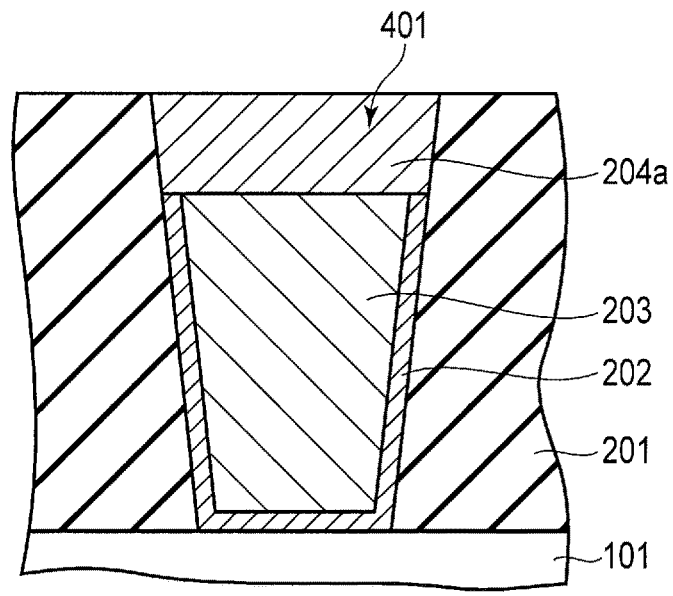
FIG. 6 is a cross-sectional view for explaining the method for manufacturing the magnetic memory following FIG. 5.

In general, according to one embodiment, a magnetic memory is disclosed. The magnetic memory includes a substrate and an underlying layer provided on the substrate. The underlying layer includes a first underlying layer and a second underlying layer surrounding an upper part of the first underlying layer. The first and second underlying layers contain a metal of a same type. The first underlying layer includes a lower part which is greater than the upper part in width. A magnetoresistive element provided on the underlying layer is further included.

In general, according to one embodiment, a method for manufacturing a magnetic memory including a substrate and a magnetoresistive element provided on the substrate is disclosed. The method includes: forming a first underlying layer on the substrate, the first underlying layer being conductive; forming a mask on the first underlying layer; and applying oxidation treatment or nitriding treatment to the first underlying layer in a state where the mask is provided on the first underlying layer. The method further includes: forming a first magnetic layer, a tunnel barrier layer and a second magnetic layer in series on the first and second underlying layers; and forming a magnetoresistive element comprising the first magnetic layer, the tunnel barrier layer and the second magnetic layer by processing the first magnetic layer, the tunnel barrier layer and the second magnetic layer.

In the following, the magnetic memory of the present embodiment will be described with reference to the drawings. In the drawings, portions identical to each other are denoted by the same reference numbers. Further, the same description may be repeated as necessary.

FIG. 1 is a plan view schematically showing a magnetic memory according to a first embodiment, FIG. 2 is a cross-sectional view taken along line 2-2 of FIG. 1, and FIG. 3 is a cross-sectional view taken along broken line 3-3 of FIG. 1. In the present embodiment, the magnetic memory is a magnetic random access memory (MRAM) using an MTJ element as a storage element.

In the figures, 101 denotes a silicon substrate (semiconductor substrate), an isolation region 102 is formed in a surface of the silicon substrate 101. The isolation region 102 defines active areas.

The MRAM of the present embodiment comprises a first select transistor whose gate electrode is a word line WL1, a first MTJ element M connected to one source/drain region 104 (drain region D1) of the first select transistor, a second transistor whose gate electrode is a second word line WL2, and a second MTJ element M connected to one source/drain region 104 (drain region D2) of the second select transistor. In the figures, 103 denotes a cap insulating film.

That is, one memory cell of the present embodiment comprises one MTJ (memory element) and one select transistor, and the two select transistors of the two neighboring memory cells share the other source/drain region 104 (source region S1, S2).

The gate (gate insulating film, gate electrode) of the select transistor of the present embodiment is buried in the surface of the silicon substrate 101. That is, the gate of the present embodiment has a BG (Buried Gate) structure. Similarly, the gate (word line I-WL) for the isolation also has the BG structure.

One source/drain region 104 (D1) of the first select transistor is connected to a lower part of the first MTJ element M via a plug BC. An upper part of the first MTJ element M is connected to a second bit line BL2 via a plug TC.

The other source/drain region 104 (S1) of the first select transistor is connected to a first bit line (source line) BL1 via a plug SC.

In the present embodiment, the plane patterns of plug BC, MTJ element M, plug TC and plug SC are circular, however, other shapes may be employed.

One source/drain region 104 (D2) of the second select transistor is connected to a lower part of the second MTJ element M via a plug BC. An upper part of the second MTJ element M is connected to the second bit line BL2 via a plug TC.

The other source/drain region 104 (S2) of the second select transistor is connected to the first bit line BL1 via the plug SC.

The first select transistor, first MTJ element M, second select transistor and second MTJ element M (two memory cells) are provided in each active area. Two neighboring active areas are isolated by the isolation region 102.

Word lines WL3 and WL4 correspond to the word lines WL1 and WL2, respectively. Accordingly, two memory cells are constituted by a first select transistor whose gate electrode is the word line WL3, a first MTJ element M connected to one source/drain region of the first select transistor, a second transistor whose gate electrode is a second word line WL2, and a second MTJ element M connected to one source/drain region 104 of the second select transistor.

The magnetic memory of the present embodiment will now be described according to its manufacturing method. FIG. 4 to FIG. 14 are cross-sectional views for explaining the method for manufacturing the magnetic memory of the present embodiment.

[FIG. 4]

The above-described isolation area and select transistor (not shown) are formed in the silicon substrate 101 by a well-known method. Subsequently, an interlayer insulating film 201 is formed on the silicon substrate 101, and a contact plug 203 is formed in the interlayer insulating film 201 via a barrier metal film 202 by a well-known damascene process. The shape of the plug including the barrier metal film 202 and contact plug 203 (plug BC) is a circular truncated cone. The radius of this plug is greater toward the upper side. In other words, in the cross-sectional surface shown in FIG. 4, the plug has the taper shape whose width increases toward upward.

Interlayer insulating film 201 is, for example, a silicon oxide film. The barrier metal film 202 includes, for example, a laminated film of a Ti film and a TiN film. The material of contact plug 203 contains, for example, tungsten or titanium nitride, and is crystalline. The barrier metal film 102 may be unnecessary depending on the material of contact plug 203. The exposed surfaces of interlayer insulating film 201, the barrier metal film 202 and contact plug 203 are planarized by the chemical mechanical polishing (CMP) process of the above-described damascene process.

[FIG. 5]

By means of an etch-back process, the upper parts of the barrier metal film 202 and contact plug 203 are removed. As a result, a concave portion 401 having a taper shape whose width increases toward upward is generated on the surface of the interlayer film 201. The etch-back process is performed by using, for example, a reactive ion etching (RIE) process.

[FIG. 6]

By the damascene process, a first underlying layer 204a is formed in the recess 401, and the surface is planarized. In the present embodiment, the shape of the first underlying layer 204a is a circular truncated cone. The diameter of the first underlying layer 204a is greater toward the upper side. The shape of the first underlying layer 204a may be a rectangular parallelepiped.

In the present embodiment, the material (metal or a conductive material) of the first underlying layer 204a contains, for example, at least one of tantalum (Ta), titanium (Ti), aluminum (Al), magnesium (Mg), tungsten (W), hafnium (Hf) and zirconium (Zr).

The damascene process includes a step of depositing the material of the first underlying layer 204a, and a step of polishing the deposited material. These steps are performed by using a CMP apparatus.

[FIG. 7]

A sample including the members 101 and 201 to 204a is taken out of the CMP apparatus, and is exposed to the air. As a result, an oxidized film 402 is formed on the top surface of the first underlying layer 204a. The oxidized film 402 contains the material (metal or conductive material) of the first underlying layer 204a.

[FIG. 8]

Figure 7:
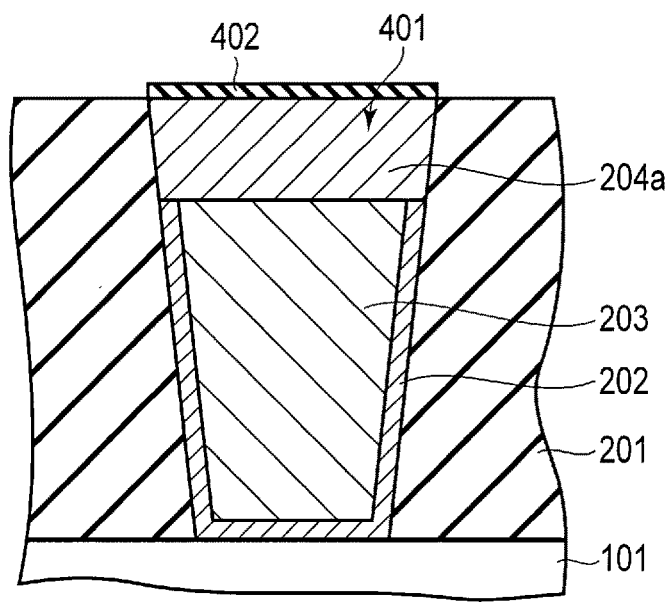
FIG. 7 is a cross-sectional view for explaining the method for manufacturing the magnetic memory following FIG. 6.
Figure 10:
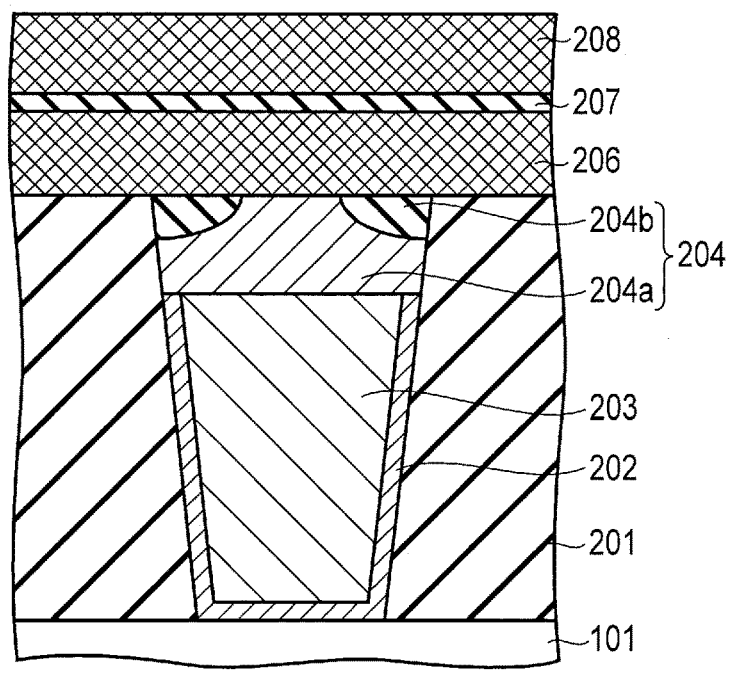
FIG. 10 is a cross-sectional view for explaining the method for manufacturing the magnetic memory following FIG. 9.
Figure 11:
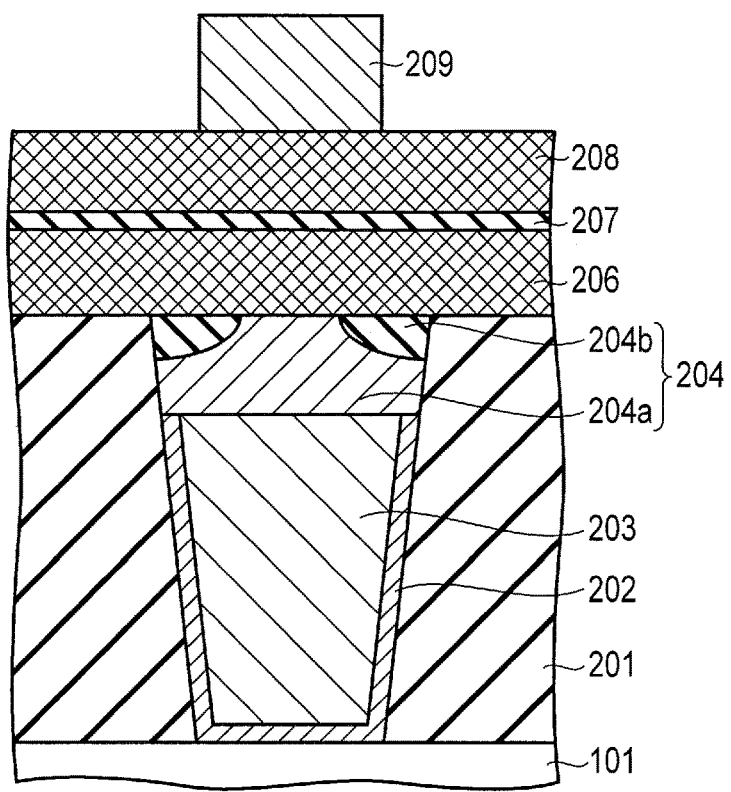
FIG. 11 is a cross-sectional view for explaining the method for manufacturing the magnetic memory following FIG. 10.

The oxidized film 402 shown in FIG. 7 is removed by dry cleaning process.

With regard to an MTJ element 301 of a comparative example shown in FIG. 15, FIG. 16 shows the research result of the relationship between the dry cleaning time and the current flowing between the MTJ element 301 and the underlying layer 204a. From FIG. 16, it can be seen that the current flowing between the underlying layer 204a and the MTJ element 301 increases with the dry cleaning time. Therefore, the oxidized film 402 is considered as one of the factors that increases the resistance between the first underlying layer 204a and the MTJ element 301 formed on the first underlying layer 204a. For this reason, in the present embodiment, the oxidized film 402 is removed.

Afterward, a resist pattern 403 is formed on the first underlying layer 204a such that the peripheral part of the upper surface of the first underlying layer 204a is exposed.

[FIG. 9]

By the oxidation under an oxygen plasma atmosphere (plasma oxidation), the exposed surface of the first underlying layer 204a is oxidized, thereby the upper part of the first underlying layer 204a is converted to a second underlying layer (oxide layer) 204b, and thereby the first underlying layer 204a is changed to include a lower part which is greater than the upper part in width. In this manner, a underlying layer 204 including the first underlying layer 204a and the second underlying layer 204b surrounding the upper part of the first underlying layer 204a is obtained. The plasma oxidation is performed by using, for example, gaseous ozone.

As described above, the material of the first underlying layer 204a contains, for example, at least one of Ta, Ti, Al, Mg, W, Hf and Zr, so that the second underlying layer 204b is, for example, a layer of an oxide containing at least one of Ta, Ti, Al, Mg, W, Hf and Zr.

Instead of oxidation treatment such as oxidation plasma, nitriding treatment may be employed. In this case, the exposed surface of the first underlying layer 204a is oxidized, thereby converting the upper part of the first underlying layer 204a to the second underlying layer (nitride layer) 204b.

In the present embodiment, the upper part of the first underlying layer 204a after oxidation includes an upper surface and a side surface corresponding to the upper surface and the side surface of the circular truncated cone, the second underlying layer 204b is provided on the side surface of the upper part of the first underlying layer 204a. When the shape of the first underlying layer 204a is a rectangular parallelepiped, the upper part of the first underlying layer 204a after oxidation includes an upper surface and a side surface corresponding to the upper surface and the side surface of the circular truncated cone, the second underlying layer 204b is provided on the side surface of the upper part of the first underlying layer 204a.

The barrier metal film 202, contact plug 203, the first underlying layer 204a, and the second underlying layer 204b correspond to plug BC shown in FIG. 1 to FIG. 3.

[FIG. 10]

The resist pattern 403 shown in FIG. 9 is removed, thereafter, by means of a sputtering process, layers constituting the MTJ element, which includes a first magnetic layer 206 as a storage layer, a tunnel barrier layer 207, and a second magnetic layer 208 as a reference layer, are sequentially formed on the whole surface (the exposed surfaces of interlayer insulating film 201, the first underlying layer 204a and the second underlying layer 204b).

The second underlying layer 204b is more rigid than the magnetic layers 206 and 208. In other words, the second underlying layer 204b is more difficult to be etched than the magnetic layers 206 and 208. Therefore, the etching residue which is caused when the second underlying layer 204b is processed by IBE is sufficiently less than that of the magnetic layers 206 and 208.

The first underlying layer 204a is more rigid than the magnetic layers 206 and 208. If the first underlying layer 204a under the second underlying layer 204b is not exposed when the second underlying layer 204b is processed by IBE, no etching residue due to the first underlying layer 204a is generated.

A layer constituting the MTJ element other than the first magnetic layer 206, the tunnel barrier layer 208 and the second magnetic layer 208 includes, for example, a shift cancelling layer (not shown). The shift cancelling layer is formed on the second magnetic layer 208. The first and second magnetic layers 206 and 208 may be a reference layer and a storage layer, respectively.

[FIG. 11]

A conductive hard mask 209 is formed on the second magnetic layer 208. The hard mask 209 is also used as the upper electrode of the MTJ element. In the present embodiment, the plane pattern of the hard mask 209 is circular, the diameter of the hard mask 209 is less than that of the underlying layer 204, and when viewed from above the hard mask 209, the hard mask 209 is arranged in the underlying layer 204. The material of the hard mask 209 is, for example, TiN, Ti, Ta or W.

[FIG. 12]

The MTJ element 301 is formed by sequentially processing the second magnetic layer 208, the tunnel barrier layer 207 and the first magnetic layer 206 by using IBE process while the hard mask 209 is employed as a mask. The MTJ element 301 includes the layers 206 to 209 and corresponds to the MTJ element M shown in FIG. 1 to FIG. 3. The MTJ element 301 has a taper shape whose width decreases toward upward. When viewed from above the MTJ element 301, the second underlying layer 204b is arranged around the MTJ element 301. A part of the second underlying layer 204b is present under the MTJ element 301. The MTJ element 301 covers the whole upper surface of the first underlying layer 204a, and the upper surface of the second underlying layer 204b around the upper surface of the first underlying layer 204a.

In the present embodiment, the second underlying layer 204b is more rigid than the magnetic layers 206 and 208. Therefore, during the etching process (IBE process) of the second magnetic layer 208, the tunnel barrier layer 207 and the first magnetic layer 206, the disappearance of the second underlying layer 204b and the etching of the first underlying layer 204a are suppressed. In other words, during the etching process, the generation of etching residue of the first underlying layer 204a is suppressed. Thereby the short-circuiting of the first magnetic layer 2-6 and the second magnetic layer 208, which results from the adherence of etching residue of the first underlying layer 204a to sidewalls of the laminated body 206, 207, 208, is suppressed.

During the plasma oxidation, oxygen plasma collides with the sidewall of the resist pattern 403, so that the width of the resist pattern 403 becomes narrower with the lapse of time. As a result, the area of the exposed surface of the first underlying layer 204a becomes with the lapse of time. The formation of the second underlying layer 204b is advanced toward the central portion from the peripheral part of the upper surface of the first underlying layer 204a.

As described above, the width of the resist pattern 403 becomes narrower with the lapse of time, so that a region more distant from the peripheral part of the upper surface of the first underlying layer 204a is exposed to oxygen plasma in a shorter time. As a result, the thickness of the second underlying layer 204b is less toward the central portion from the peripheral part of the upper surface of the first underlying layer 204a. In other words, the thickness of the second underlying layer 204b is increased toward the lower end from the upper end of the side surface of the upper part of the first underlying layer 204a. In addition, when the shape of the first underlying layer 204a is a rectangular parallelepiped, the thickness of the underlying layer 204b is substantially constant.

In the present embodiment, the plasma oxidation is performed such that the resist pattern 403 does not disappear. That is, the plasma oxidation is performed such that the whole upper surface of the first underlying layer 204a does not become the second underlying layer 204b. This is because the resistance of the second underlying layer 204b is higher than that of the first underlying layer 204a, and the resistance between the first underlying layer 204a and the MTJ element is increased. In the present embodiment, the upper surface (Ta) of the first underlying layer 204a is underneath the resist pattern 403, so that the increase in the resistance between the first underlying layer 204a and the MTJ element is suppressed.

Figure 14:
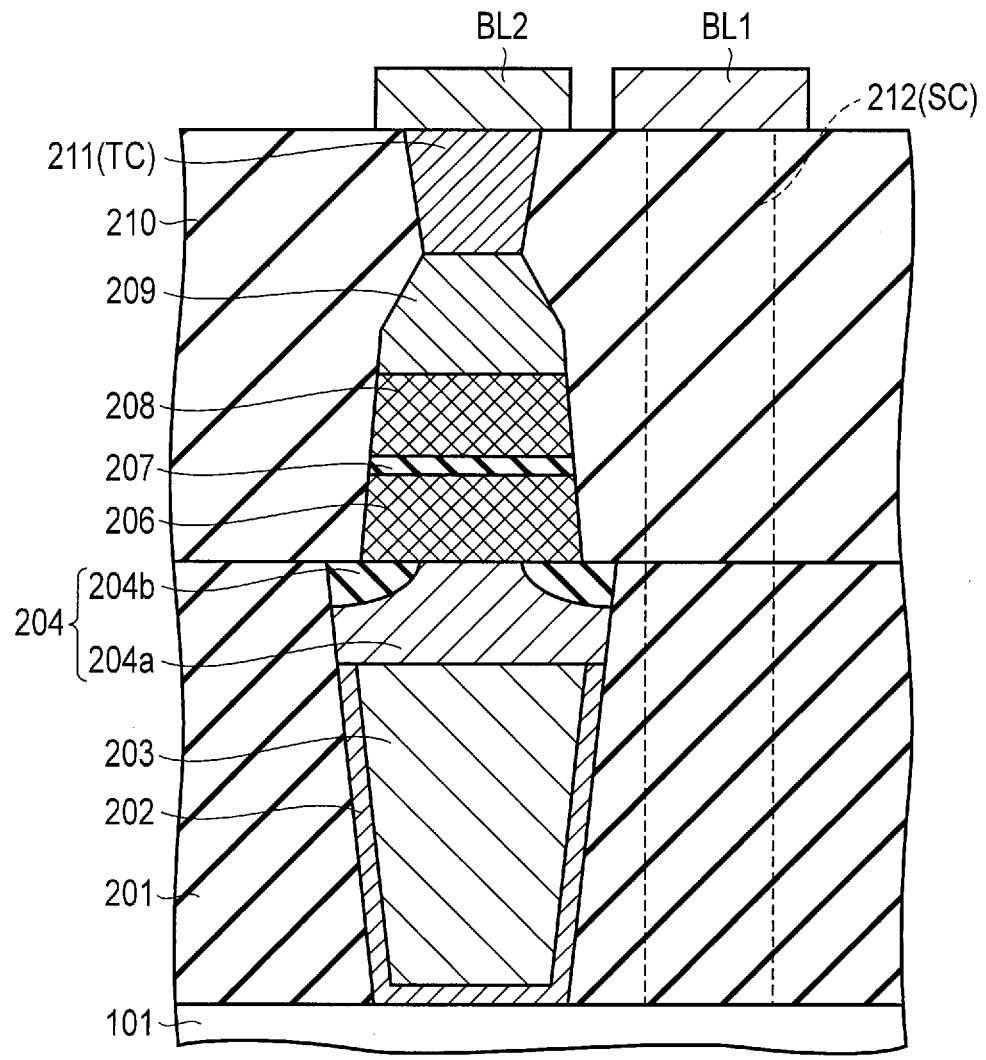
FIG. 14 is a cross-sectional view for explaining the method for manufacturing the magnetic memory following FIG. 13.

With regard to the MTJ element of a comparative example shown in FIG. 17, FIG. 18 shows the research result of the relationship between the thickness of an insulating film 502 and the defective short-circuit ratio of the MTJ element. The insulating film 502 is a layer whose material is an oxide or nitride of metal (conductive material) constituting the underlying layer 204a. From FIG. 16, it is seen that the defective short-circuit ratio becomes lower as the thickness of the insulating film 502 increases. For this reason, the second underlying layer 204b shown in FIG. 14 is preferably thick.

The second underlying layer 204b is more rigid than the first underlying layer 204a. In addition, the second underlying layer 204b is more rigid than the magnetic layers 206 and 208. Therefore, an amount of the etching residue of the second underlying layer 204b is small, thereby, a sidewall (not shown) including the etching residue of the second underlying layer 204b, which is to be formed on the sidewall of the laminated body 206, 207, 208, can be thinned. Therefore, the etching residue of the second underlying layer 204b, which adheres to the sidewall of the laminated body 206, 207, 208 becomes small in quantity. That is, unnecessary substances attached to the sidewall of the laminated body 206, 207, 208 are decreased.

Furthermore, the etching residue of the second underlying layer (oxide layer) 204b is an insulator, so that even if the etching residue of the second underlying layer 204b adheres to the sidewalls of the laminated body 206, 207, 208, the problem of short-circuiting does not occur.

[FIG. 13]

An interlayer insulating film 210 is formed on the whole surface on the MTJ element 301 side, and the top surface of interlayer insulating film 210 is planarized by CMP process. The interlayer insulating film 210 is, for example, a silicon oxide film. The interlayer insulating film 210 is formed by, for example, CVD process.

By using a damascene process, a connection hole reaching the hard mask 209 is formed in interlayer insulating film 210, then a contact plug 211 is formed in the connection hole. The contact plug 211 corresponds to plug TC shown in FIG. 1 to FIG. 3.

[FIG. 14]

In a similar manner, by using the damascene process, a connection hole reaching the other one of the source/drain areas 104 (S1) of the first select transistor shown in FIG. 2 is formed in the interlayer insulating film 210, then contact plug 212 is formed in the connection hole. The contact plug 212 corresponds to the plug SC shown in FIG. 1 to FIG. 3. Thereafter, bit lines BL2 and BL1 are formed on contact plugs 211 and 214, respectively.

When the miniaturization of the MRAM is further advanced, the distance between contact plug 212 and the underlying layer 204 may be short because of a misalignment. The edge of the second underlying layer 204b is outside that of the first underlying layer 204a, so that when the misalignment occurs, the contact plug 212 is in contact with the second underlying layer 204b prior to the first underlying layer 204a. Therefore, when the misalignment is to the extent that the contact plug 212 is not in contact with the first underlying layer 204a, the short-circuiting between contact plug 212 and the underlying layer 204 can be avoided.

Figure 19:
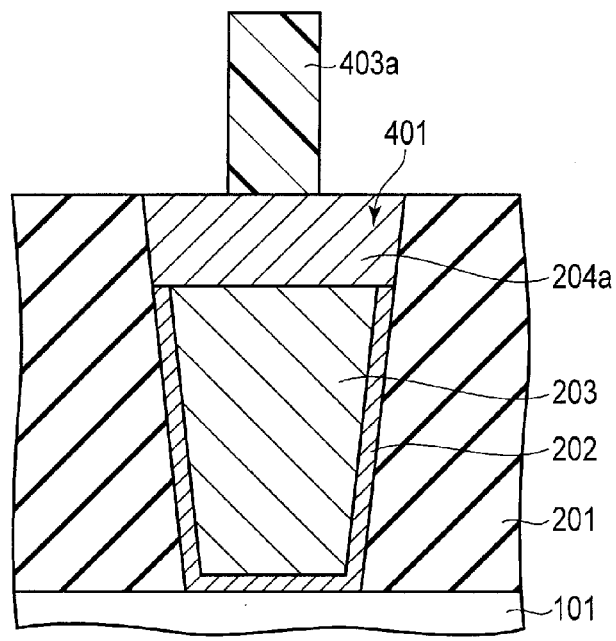
FIG. 19 is a cross-sectional view for explaining a method for manufacturing a magnetic memory according to another embodiment.
Figure 20:
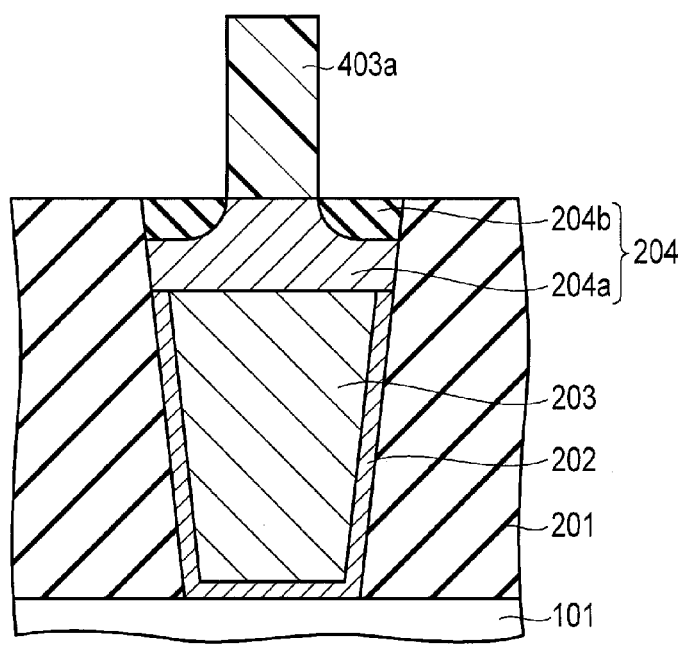
FIG. 20 is a cross-sectional view for explaining the method for manufacturing the magnetic memory following FIG. 16.

In the present embodiment, the second underlying layer 204b is formed by oxygen plasma, however, as shown in FIG. 19 and FIG. 20, the second underlying layer 204b may be formed by thermal oxidation. The steps of FIG. 19 and FIG. 20 correspond to those of FIG. 8 and FIG. 9, respectively.

In the step of FIG. 19, a resist pattern 403a is formed on the first underlying layer 204a. The width of the resist pattern 403a is not changed by thermal oxidation. Therefore, the resist pattern 403a is formed such that an upper surface of the first underlying layer 204a to be converted to the second underlying layer 204b is exposed. In the step of FIG. 20, the second underlying layer 204b is formed by thermally oxidizing the first underlying layer 204a while the resist pattern 403a is used as a mask. The thickness of the second underlying layer 204b is substantially constant.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a magnetic memory comprising a substrate and a magnetoresistive element provided on the substrate, the method comprising:
   forming a first underlying layer having conductivity on the substrate;
   forming a mask on the first underlying layer;
   applying oxidation treatment or nitriding treatment to the first underlying layer in a state where the mask is present on the first underlying layer;
   sequentially forming a first magnetic layer, a tunnel barrier layer and a second magnetic layer on the first and second underlying layers; and
   forming a magnetoresistive element comprising the first magnetic layer, the tunnel barrier layer and the second magnetic layer by processing the first magnetic layer, the tunnel barrier layer and the second magnetic layer.

2. The method according to claim 1, wherein the oxidation treatment is performed by using oxygen plasma or thermal oxidation.

3. The method according to claim 1, wherein the processing the first magnetic layer, the tunnel barrier layer and the second magnetic layer is performed by using an ion beam etching (IBE).

4. The method according to claim 1, further comprising applying an etching process to the first underlying layer before the mask is formed.

5. The method according to claim 4, wherein an oxidized film is formed on the first underlying layer before the etching process is applied.

6. The method according to claim 1, wherein the mask includes a resist pattern.

7. The method according to claim 1, wherein the first underlying layer contains a conductive material, and the second underlying layer contains an oxide of the material.

8. The method according to claim 7, wherein the conductive material contains at least one of tantalum (Ta), titanium (Ti), aluminum (Al), magnesium (Mg), tungsten (W), hafnium (Hf) and zircon (Zr).

9. A magnetic memory comprising:
a substrate;
a underlying layer provided on the substrate, the underlying layer including a first underlying layer and a second underlying layer surrounding an upper part of the first underlying layer, the first and second underlying layers containing a metal of a same type, and the first underlying layer comprising a lower part which is greater than the upper part in width; and
a magnetoresistive element provided on the underlying layer.

10. The magnetic memory according to claim 9, wherein the second underlying layer is thicker as the second underlying layer is more distant from the upper part of the first underlying layer.

11. The magnetic memory according to claim 9, wherein an upper surface and a side surface of the upper part of the first underlying layer intersect at a substantially right angle.

12. The magnetic memory according to claim 1, further comprising a contact plug reaching the substrate, and wherein the contact plug is adjacent to the magnetoresistive element, and is not in contact with the first underlying layer.

13. The magnetic memory according to claim 9, wherein when viewed from above the magnetoresistive element, the underlying layer is smaller than the magnetoresistive element, and the second underlying layer is arranged around the magnetoresistive element.

14. The magnetic memory according to claim 13, wherein the magnetoresistive element comprises a first magnetic layer, a tunnel barrier layer provided on the first magnetic layer, and a second magnetic layer provided on the tunnel barrier layer.

15. The magnetic memory according to claim 9, wherein the magnetoresistive element covers a whole upper surface of the first underlying layer and a part of an upper surface of the second underlying layer.

16. The magnetic memory according to claim 15, wherein the first underlying layer contains a conductive material, and the second underlying layer contains an oxide of the material.

17. The magnetic memory according to claim 16, wherein the conductive material contains at least one of tantalum (Ta), titanium (Ti), aluminum (Al), magnesium (Mg), tungsten (W), hafnium (Hf) and zirconium (Zr).

18. The magnetic memory according to claim 9, wherein the second underlying layer is provided on a side surface of the upper part of the first underlying layer.

19. The magnetic memory according to claim 18, wherein the second underlying layer is thicker toward a lower end from an upper end of the side surface of the upper part of the first underlying layer.

20. The magnetic memory according to claim 18, wherein the second underlying layer is substantially constant in thickness.

* * * * *